United States Patent [19]
Miyawaki et al.

[11] Patent Number: 5,280,453
[45] Date of Patent: Jan. 18, 1994

[54] SEMICONDUCTOR MEMORY DEVICE WITH NOISE REDUCTION SYSTEM

[75] Inventors: Masahumi Miyawaki; Tamihiro Ishimura, both of Tokyo, Japan

[73] Assignee: Oki Electric Industry Co., LTd., Tokyo, Japan

[21] Appl. No.: 705,341

[22] Filed: May 24, 1991

[30] Foreign Application Priority Data

May 31, 1990 [JP] Japan .................. 2-142665

[51] Int. Cl.$^5$ .............................................. G11C 7/02
[52] U.S. Cl. .................................................. 365/206
[58] Field of Search ........................ 365/206, 207, 208

[56] References Cited

U.S. PATENT DOCUMENTS 5,030,859 7/1991 Ihara ............................. 365/206 X

FOREIGN PATENT DOCUMENTS 60-206161 10/1985 Japan .

Primary Examiner—James B. Mullins
Attorney, Agent, or Firm—Spencer, Frank & Schneider

[57] ABSTRACT

An integrated circuit semiconductor memory device includes a memory array having memory cells. A sensing circuit is coupled to the memory cells through one of first and second bit lines. A first conductive line is for applying a first voltage potential to the sensing circuit, and a second conductive line is for applying a second voltage potential to the sensing circuit. A first field effect transistor is provided having first, second electrodes connected to the first conductive line, and a gate electrode connected to the second conductive line. The sensing circuit has a second field effect transistor and a third field effect transistor of an opposite channel type to the second field effect transistor. The first, second and gate electrodes of the first field effect transistor are formed substantially simultaneously with the first, second and gate electrodes of one of the second and third field effect transistors during manufacture of the integrated circuit semiconductor memory device. Also, the first conductive line is formed substantially simultaneously with the second conductive line during manufacture of the integrated circuit semiconductor memory device.

9 Claims, 5 Drawing Sheets

SEMICONDUCTOR MEMORY DEVICE WITH NOISE REDUCTION SYSTEM

BACKGROUND OF THE INVENTION

1. Field of the Invention

The present invention relates to a semiconductor memory device, such as Dynamic Random Access Memory (DRAM) and static Random Access Memory (SRAM), particularly to a semiconductor memory device employing a voltage noise reduction system therein to reduce voltage noises generated by the internal circuit thereof.

2. Description of the Related Art

A semiconductor memory device having voltage a noise reduction system, for example, is disclosed in the Japanese Laid-open patent publication No. 60-206161, published on Oct. 17, 1985, of which the entire disclosure is incorporated herein by reference.

The disclosed noise reduction system in the above mentioned publication, as disclosed in FIG. 1 thereof (not shown in this specification), employs a first level aluminum layer 10 formed on a silicon dioxide ($SiO_2$) layer 7 substantially covering the main surface of a semiconductor substrate 1, a dielectric ($SiO_2$, Nitride or $Ta_2O_5$) layer 12 formed on the first level aluminum layer 10 and a second level aluminum layer 11 formed on the dielectric layer 12 so as to form a composite layer of the first level aluminum, dielectric and second level aluminum layers 10, 12 and 11. The first level aluminum layer 10 supplies the drain region 2 of a transistor in FIG. 1 with a supply voltage while the second level aluminum layer connects the source region 3 of the transistor to the ground. Therefore, the disclosed noise reduction system can reduce voltage noises generated by the external or internal circuits of a semiconductor device since the composite layer 10, 12 and 11 employs capacitance formed between the first and second level aluminum layers 10 and 11. However this noise reduction system requires the relatively complex pattern layout for other circuits of the semiconductor memory device and, further, the additional metal layer forming process to form the second level aluminum layer (Vss Line) right over the first level aluminum layer (Vcc line) after the dielectric layer being formed on the first level aluminum layer in order to form the composite layer.

SUMMARY OF THE INVENTION

Accordingly, it is an object of the present invention to provide a semiconductor memory device having a noise reduction system, which can be formed by a simpler fabrication process.

It is also an object of the present invention to provide such a memory device employing a simpler pattern layout thereof.

It is another object of the invention to provide such a memory device able to perform the sense and/or read out operation of the data stored therein with a minimized influence caused by the voltage noises generated during the sense operation thereof.

It is still another object of the invention to provide a noise reduction system which may be formed simultaneously with an internal circuit, such as a sense amplifier, by substantially the same fabrication process.

A memory according to the present invention is provided wherein a memory array has memory cells and a sensing circuit to selectively couple at least one of the memory cells; a first conductive line applies a first voltage potential to the sensing circuit; a second conductive line, formed substantially simultaneously with said first conductive line, applies a second voltage potential to the sensing circuit; and a coupling means couples capacitively the first conductive line with the second conductive line. The coupling means includes a field-effect transistor (FET) which may be formed substantially simultaneously with other FETs in the sensing circuit.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DESCRIPTION OF THE PREFERRED EMBODIMENT

Figure 1:
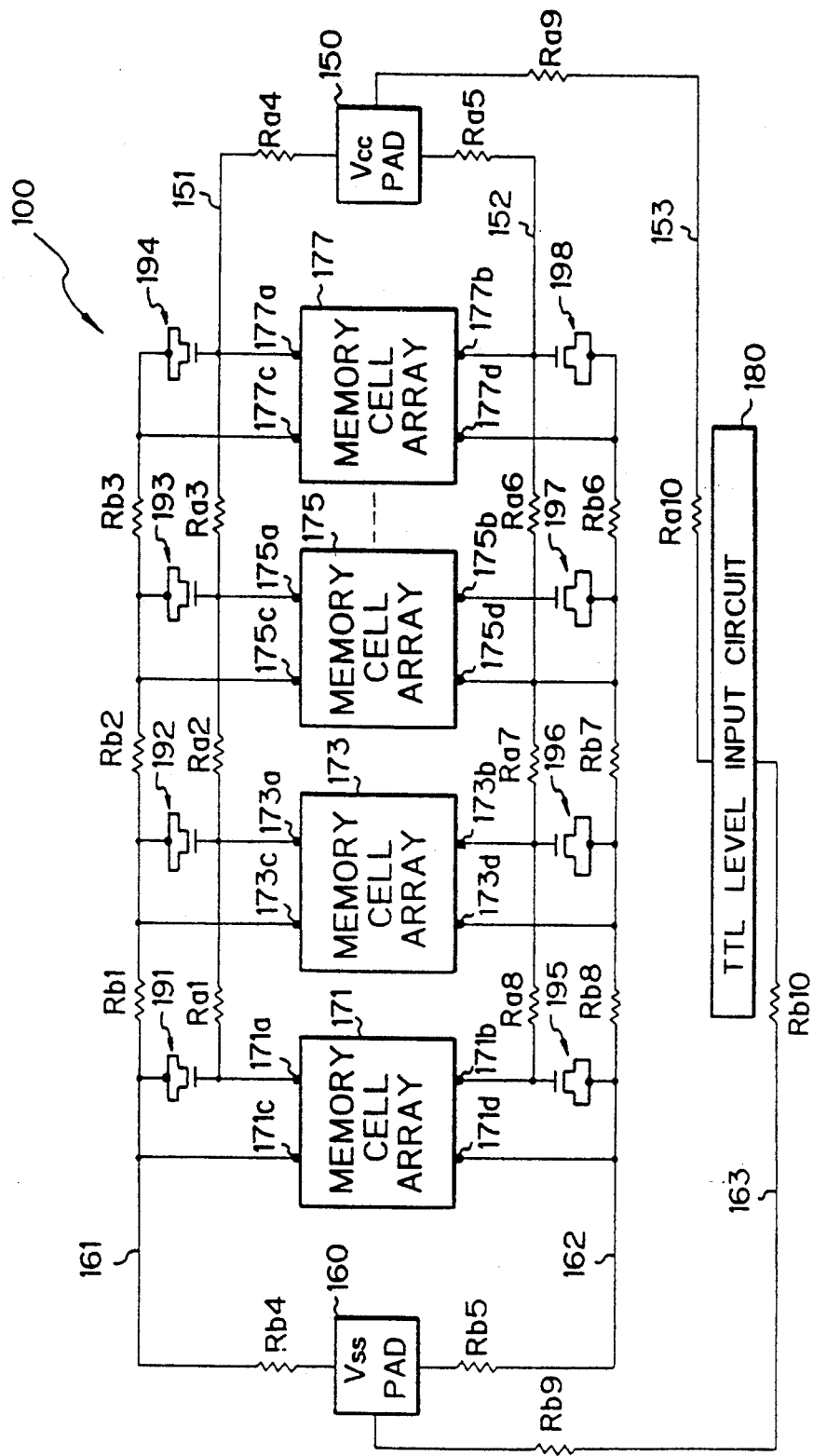
FIG. 1 is a block diagram of the semiconductor memory device constructed in accordance with the preferred embodiment of the invention.

A semiconductor memory device 100 incorporating the present invention is shown in FIG. 1. The semiconductor memory device 100 in this embodiment is a dynamic Random Access Memory (DRAM) and has a Vcc pad electrode 150 to receive a supply voltage (5 volts) from the exterior (not shown) thereof and a Vss pad electrode 160 to be connected to the ground (0 Volt) in the exterior (not shown) thereof.

The Vcc pad electrode 150 has first and second conductive lines 151 and 152 each, to supply the supply voltage thereto the sense amplifier (discussed later) in respective memory cell arrays 171, 173, 175 and 177, and a third conductive line 153 to supply the supply voltage thereto to a conventional Transistor Transistor Logic (TTL) level input circuit 180. The conventional TTL level input circuit 180, for example, an input buffer circuit, generally receives at TTL level address signals and control signals, such as RAS and CAS, and supplies such signals at the MOS logic level to the interior circuits of the semiconductor memory device.

The first, second and third conductive lines 151, 152 and 153 are each composed of Aluminum or another material and has a respective resistance as indicated by Ra1-Ra10 in FIG. 1.

Similarly to the Vcc pad electrode 150, the Vss pad electrode 160 has fourth, fifth conductive lines 161 and 162 each, to supply the ground voltage (0 volt) to the sense amplifier in the respective memory cell arrays 171-177, and a sixth conductive line 163 to supply the ground voltage to the conventional TTL level input circuit 180. The fourth, fifth and sixth conductive lines 161, 162 and 163 are each also composed of Aluminum or another metal material and have respective resistance as indicated by Rb1–Rb10.

These first - sixth conductive lines 151, 152, 153, 161, 162, 163 may be substantially simultaneously formed by the same conventional metal process.

The memory cell arrays 171-177 are selectively operable in response to the address and control signals from the TTL level input circuit 180. The memory cell arrays 171-177 respectively have supply voltage input terminals 171a, 171b, 173a, 173b, 175a, 175b, 177a and 177b and ground voltage input terminals 171c, 171d, 173c, 173d, 175c, 177c and 177d. The supply voltage input terminals 171a, 173a, 175a and 177a are respectively connected to the first conductive line 151 while the supply voltage input terminals 171b, 173b, 175b and 177b are respectively connected to the second conductive line 152. On the other hand, the ground voltage input terminal 171c, 173c, 175c, 177c are respectively connected to the fourth conductive line 161 while the ground voltage input terminal 171d, 173d, 175d, 177d are respectively connected to the fifth conductive line 162. The first and second conductive line 151 and 152 are respectively coupled to the fourth and fifth conductive lines through field-effect transistors (FETs) 191-198 respectively adjacent to the corresponding memory cell arrays 171-177. Each of FETs 191-198 is of a negative channel type in this embodiment, therefore the control electrode (gate) of FETs 191-198 is connected to the either first or second conductive line 151 or 152 while the source, drain electrodes each of FETs 191-198 are commonly connected to the either fourth or fifth conductive line 161 or 162.

A positive channel type FET (not shown), instead of the N-channel type FETs 191-198 in this embodiment, may be available, provided that the control electrode thereof is connected to the either fourth of fifth conductive lines 161 or 162 while the source, drain electrodes thereof are commonly connected to the either first or second conductive line 151 or 152.

Figure 2:
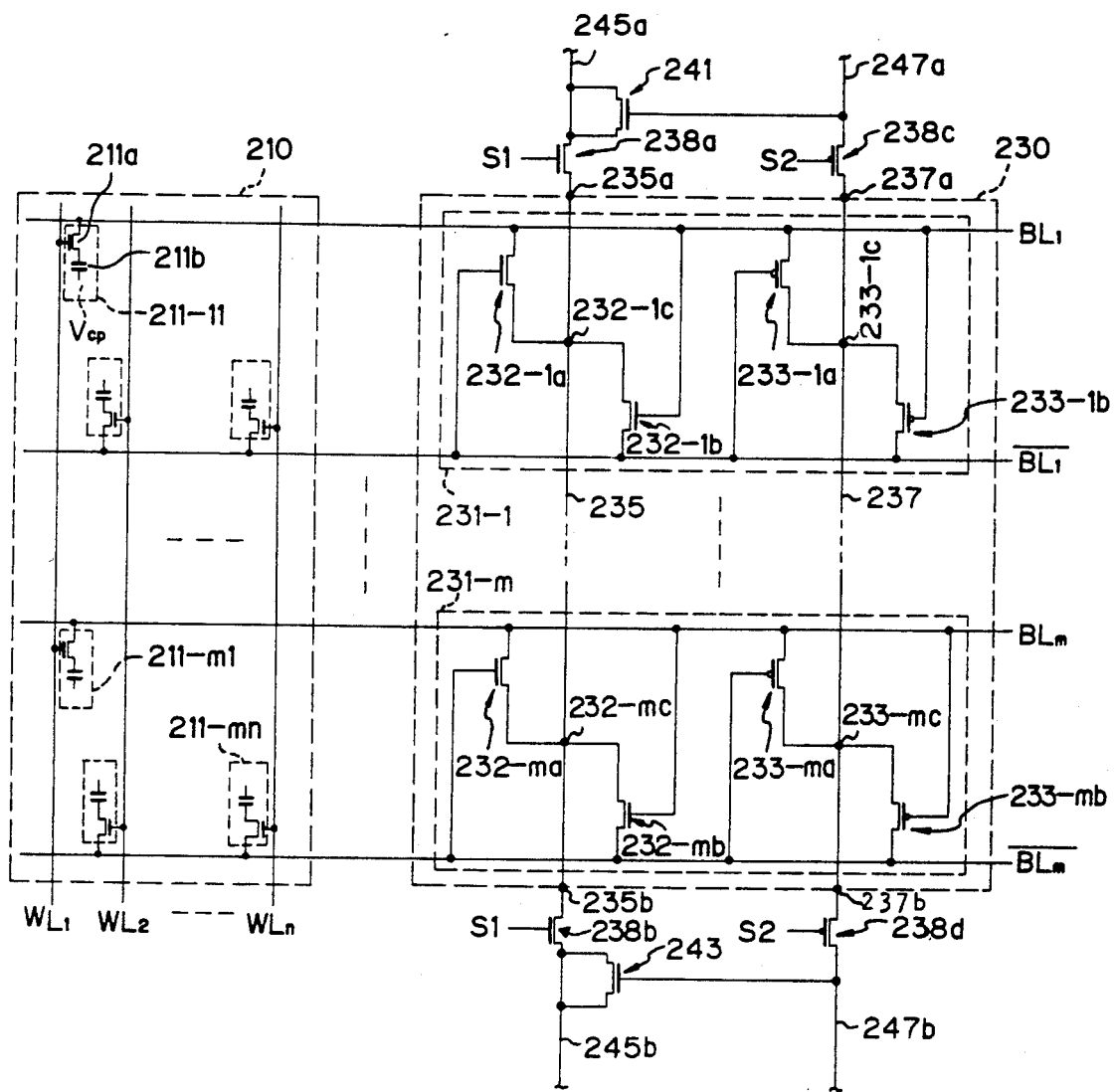
FIG. 2 is a partial circuit diagram of the device shown in FIG. 1.

Now, one of the memory cell arrays 171-177 and some peripheral circuits according to the present invention are more specifically shown in FIG. 2. A memory cell array 200 has a memory cell area 210 and a sense amplifier area 230.

In the memory area 210, word lines WL1–WLn are respectively extending in a word line direction and pairs of bit lines BL1 and $\overline{BL1}$–BLm and $\overline{BLm}$ are respectively extending in a bit line direction perpendicular to the word line directions. There are also memory cells 211-11–211-mn each in this area coupled to respective word and bit lines as shown in FIG. 2. For example, the memory cell 211-11 has a field-effect transistor 211a and a storage capacitor 211b. The gate electrode of the field-effect transistor 211a is connected to the word line WL1; the first (drain) electrode is connected to the bit line BL1; the second (source) electrode is connected to the first electrode of the storage capacitor 211b; and the second electrode of the storage capacitor 211b is connected to a predetermined constant voltage potential Vcp (a half of the supply voltage Vcc). The structure of remaining memory cells each is quite similar to that of the memory cell 211-11.

In the sense amplifier area 230, there are sense amplifiers 231-1–231-m each having a pair of N-channel type field-effect transistors (232-1a and 232-1b–232 ma and 232-mb and a pair of P-channel type field-effect transistors (233-1a and 233-1b–233-ma and 233-mb). The first (drain) electrode of the N-channel type FET 232-1a is connected to the bit line BL1; the gate electrode of the FET 232-1a is connected to the bit line $\overline{BL1}$; the second (source) electrode of the FET 232-1a is connected to the first (drain) electrode of the FET 232-1b through a first node 232-1c; the second (source) electrode of the FET 232-1b is connected to the bit line $\overline{BL1}$; and the gate of the FET 232-1b is connected to the bit line BL1. The remaining pairs of N-channel type FETs 232-ma and 232-mb are similarly coupled to each other through a first node 232-mc and the bit lines BLm and $\overline{BLm}$. The first nodes 232-1c–232-mc are commonly connected to a first common node line 235 having first and second terminals 235a and 235b at the both edge portions thereof. Similar to the pairs of the N-channel type FETs 232-1a, 232-1b–232-ma, 232-mb, the first (drain) electrode of the P-channel type FET 233-1a is connected to the bit line BL1; the gate electrode of the FET 233-1a is connected to the bit line $\overline{BL1}$; the second (source) electrode of the FET 233-1a is connected to the first (drain) electrode of the FET 233-1b through a second node 233-1c; the second (source) electrode of the FET 233-1b is connected to the bit line $\overline{BL1}$; and the gate of the FET 233-1b is connected to the bit line BL1. The remaining pairs of P-channel type FETs 233-ma and 233-mb are similarly coupled to each other through a second node 233-mc and the bit lines BLm and $\overline{BLm}$. The second nodes 233-1c-233-mc are commonly connected to a second common node line 237 having first and second terminals 237a and 237b at the both edge portions thereof.

The first and second terminals 235a and 235b of the first common node line 235 are respectively connected to the Vss lines 245a and 245b, respectively representing the fourth and fifth conductive lines 161 and 162 in FIG. 1, through respective N-channel type FETs 238a and 238b, whose gate are simultaneously supplied with first sense amplifier enabling signals S1 so as to apply to the first common node line 235 the ground potential from the Vss pad electrode 160 in FIG. 1 through the Vss line 245a and 245b, while the first and second terminals 237a and 237b of the second common node line 237 are respectively connected to the Vcc line 247a and 247b, respectively representing the first and second conductive lines 151 and 152, through respective P-channel type FETs 238c and 238d, whose gates are simultaneously supplied with second sense amplifier enabling signals S2 so as to apply to the second common node line 237 the supply voltage from the Vcc pad electrode 150 in FIG. 1 through the Vcc lines 247a and 247b.

The source electrode of the N-channel type FETs 238a and 238b are respectively coupled to the source electrode of P-channel type FETs 238c and 238d through FETs 241 and 243 respectively. As shown in FIG. 2, the both N-channel type FETs 241 and 243 represent the FETs 191-198, thereby, the gate electrodes of the FETs 241 and 243 are respectively connected to the source electrode of the P-channel type FETs 238c and 238d while the source and drain electrodes of the FETs 241 and 243 are respectively connected to the source electrodes of the FETs 238a and 238b.

Figure 3:
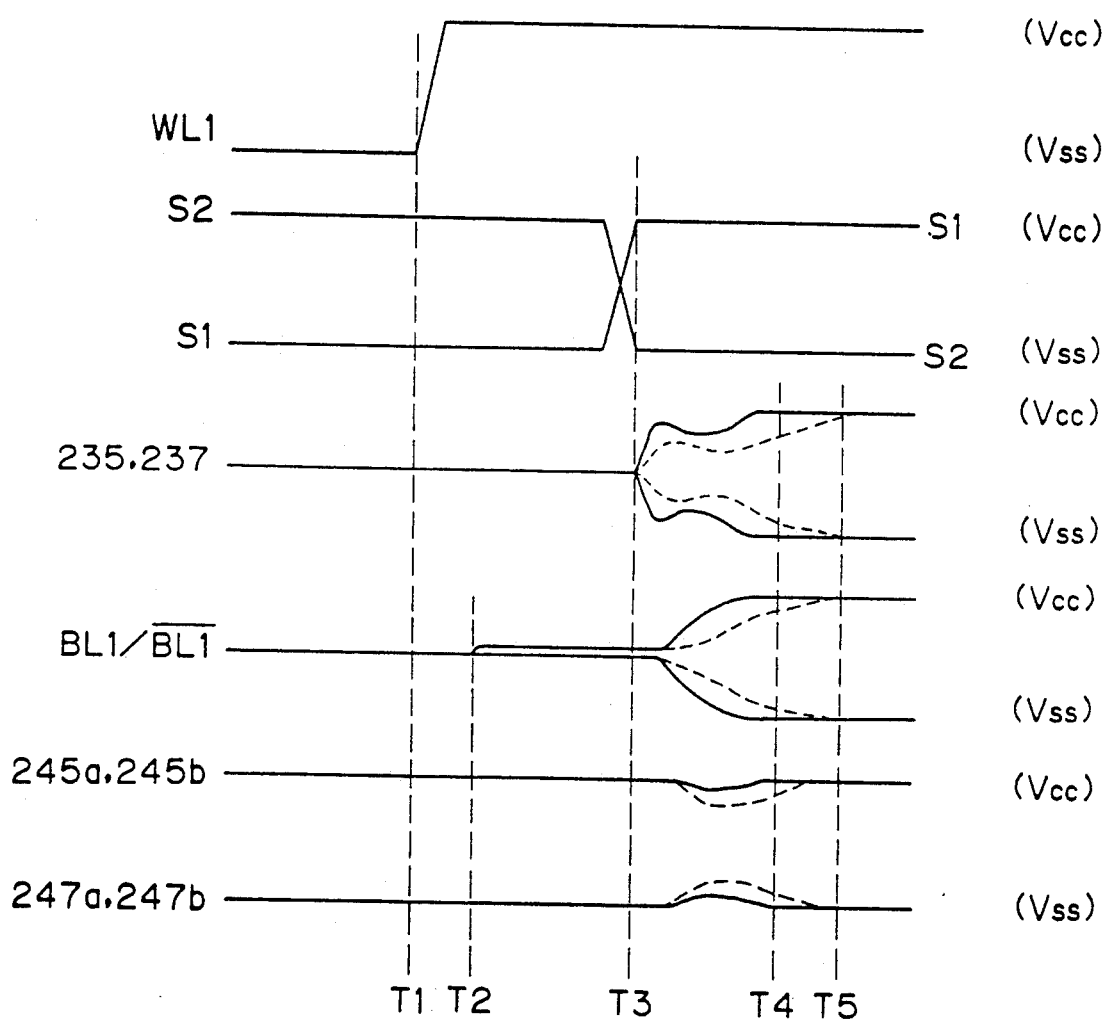
FIG. 3 is a partial chart to explain the sensing operation of the sense amplifier shown in FIG. 2.

The sense operation of the memory cell array 200 will be discussed hereafter. In the initial duration of the sense operation, only one of the word lines WL1–WLn, selected by a conventional address decoder (not shown), applies the supply voltage (Vcc) or more to gate electrodes of FETs in the memory cells coupled to the selected word line. Now assuming that the word line WL1 is selected at the first time T1 of the initial duration as shown in FIG. 3, the memory cells 211-11 and 211-m1 respectively cause on the bit lines BL1-BLm coupled thereto the small change in voltage shown in response to the stored information thereto at the succeeding second time T2. At the third time T3 of the succeeding duration, the first and second sense amplifier enabling (SAE) signals S1 and S2, the first SAE signal S1 having the supply voltage potential Vcc while the second SAE S2 having the ground potential Vss, are substantially simultaneously applied to the corresponding FETs 238a-238d, wherely the sense amplifiers 231-1-231-m are each activated so as to amplify the potential difference between the respective pairs of bit lines BL1, $\overline{BL1}$-BLm, $\overline{BLm}$. At the fourth time T4 at a full line, or T5 at a broken line on FIG. 3 of the sense amplifiers 231-1-231-m being sufficiently activated, assuming that the memory cell 211-11 stores a logically high information representing "1", the bit line BL1 can receive the supply voltage (Vcc) through the FET 233-1a, first common node line 235 and FET 238c and/or 238d and the charging current arises thereinto while the bit line $\overline{BL1}$ can be coupled to the ground (Vss) through the FET 232-1b, second common node line 237 and FETs 238a and/or 238b and the discharging current arises thereinto. The charging and discharging currents may cause voltage noises, known as Vcc or Vss noises, on the Vcc and/or Vss lines 247, 245. Such voltage noises may, however, be reduced by the FETs 241 and 243 respectively coupled between the Vcc lines 247a, 247b and the Vss lines 245a and 245b of the semiconductor memory device 100 in accordance with the present invention since the gate capacitance formed in each of FETs 241 and 243 works so as to maintain the potential difference between the Vcc and Vss lines 245a, 245b and 247a, 247b at the time of the initial duration of the sense operation, i.e., prior to the sense amplifier activation. Therefore the sense operation can be rapidly conducted by the sense amplifier 230 incorporating the present invention, as shown by the full line in FIG. 3, rather than by a conventional sense amplifier, which the sense operation is exemplarily shown by the broken line in FIG. 3.

Figure 4:
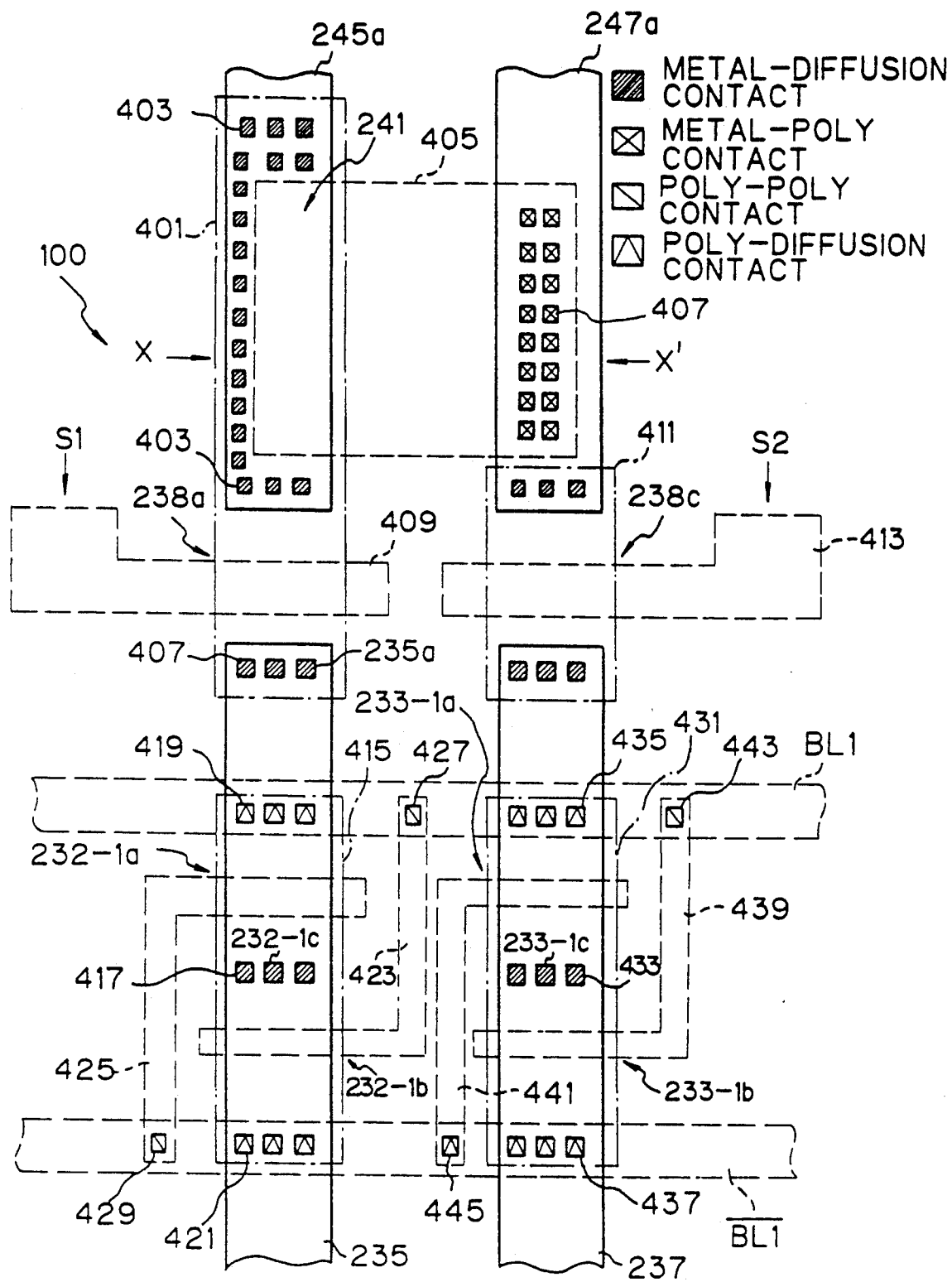
FIG. 4 is a partial pattern layout concerning the sense amplifier and the noise reduction FET of FIG. 2 in accordance with the preferred embodiment of the invention.

The layout of the sense amplifier 231-1, the FETs 238a, 238c and the Vss and Vcc lines 245a and 247a of the semiconductor device 100 are shown in FIG. 4. The Vss and Vcc 245a and 247a and the first and second common node lines 235 and 237 are respectively made of Aluminum metal layers simultaneously formed by the metal process. The edge portion of the Vss line 245a is extending over a first diffusion region 401 including the source, drain and channel region of the N-channel type FET 241. The first diffusion region 401 is electrically connected to the Vss line 245a through metal-diffusion contacts 403 formed in the contact hole of internal dielectric layers 501 and as shown in FIG. 5.

Figure 5:
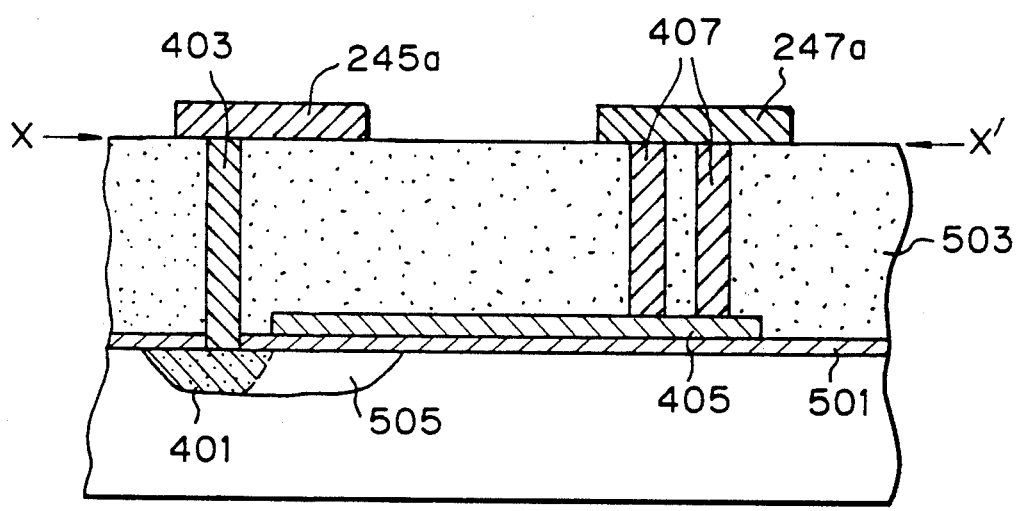
FIG. 5 is a partial cross-section taken along the line x—x in FIG. 4.

There is the gate electrode of the FET 241 made of an impurity doped poly-silicon layer 405 between the Vss line 245a and the channel region 505 of the first diffusion region 401 in FIG. 5; the channel region 505 can be either a non-diffused region or a diffused region with the same polarity as the first diffusion region 401. The poly-silicon layer 405 is electrically connected to the Vss line 247a through metal-poly contacts 407 formed in the contact hole of the internal dielectric layer 503 and insulated from the first diffusion region 401 including the channel region 505 by the internal dielectric layer 501 and from the Vss line 245a by the internal dielectric layer 503. Another modification with respect to the FET 405 is available. Instead of the embodiment shown in FIGS. 4 and 5, the poly-silicon layer 405 can be extended over and completely across the diffusion region 405 so that the source and drain regions of the FET 405 in the diffusion region 405 are completely separated by the channel (not-diffused) region of the FET 405.

The diffusion region 401 is further extended to the region under the first terminal (edge portion) 235a of the first common node line 235 connected thereto through metal-diffusion contact. The diffusion region 401 is still more separated into source and drain regions of the FET 238a by the channel (not-diffused) region where is the doped poly-silicon layer 409, receiving the first SAE signal S1, extending over and across the diffusion region 401. Thereby the Vss line 245a is connected to the first common line 235 through the FET 238a.

The Vcc line 247a is similarly connected to the second common node line 237 through the FET 238c having source and drain regions separated by the channel (not-diffused) region, formed in a diffusion region 411, where doped poly-silicon layer 413, receiving the second SAE signal S2, is extending over and across the diffusion region 411.

The first common node line 235 is extending over the bit lines BL1 and $\overline{BL1}$ and connected to the diffusion region 415 through metal diffusion contacts 417 (corresponding to the first node 232-1c), located between the bit lines BL1. The diffusion region 415 is connected to the bit line BL1 through poly-diffusion contacts 419 at one edge portion thereof and also connected to the bit line $\overline{BL1}$ through poly-diffusion contacts 421 at the other edge portion thereof. The diffusion region 415 is separated into three diffused regions by channel regions where doped poly-silicon layers 423 and 425, respectively connected to the bit lines BL1 and $\overline{BL1}$ through the poly-poly contacts 427 and 429, is extending over and across the diffusion regions.

The second common node line 237 is similarly extending over the bit lines BL1 and $\overline{BL1}$ and connected to the diffusion region 431 through metal diffusion contacts 433 (corresponding to the second node 233-1c), located between the bit lines BL1 and $\overline{BL1}$. The diffusion region 431 is connected to the bit line BL1 through poly-diffusion contacts 435 at one edge portion thereof and also connected to the bit line $\overline{BL1}$ through poly-diffusion contacts 437 at the other edge portion thereof. The diffusion region 431 is separated into three regions by channel regions where doped poly-silicon layers 439 and 441, respectively connected to the bit lines BL1 and $\overline{BL1}$ through poly-poly contacts 443 and 445, is extending over and across the diffusion regions.

As discussed foregoing, the gate, source and drain electrodes of the N-channel FET 241 may be respectively formed by the same process to form those the N-channel FETs 232-1a and 232-1b. In case a P-channel FET is used instead of the N-channel FET 241, those electrodes of the P-channel FET may be respectively formed under the Vcc line 247 by the same process to form those of the P-channel FETs 233-1a and 233-1b.

While the invention has been particularly shown and described with reference to preferred embodiments thereof, it will be understood by those skilled in the art that various changes in form and details may be made therein without departing form the spirit and scope of the invention.

What is claimed is:

1. An integrated circuit semiconductor memory device comprising:
a plurality of memory cells;
a sensing circuit coupled to said memory cells through one of first and second bit lines;
a first conductive line for applying a first voltage potential to said sensing circuit;
a second conductive line for applying a second voltage potential to said sensing circuit;
a first field effect transistor having first, second and gate electrodes;
said first and second electrodes of said first field effect transistor being connected to said first conductive line, said gate electrode of said first field effect transistor being connected to said second conductive line;
said sensing circuit having a second field effect transistor and a third field effect transistor of an opposite channel type to the second field effect transistor, said second and third field effect transistors each having first, second and gate electrodes;
said first, second and gate electrodes of said first field effect transistor being respectively formed substantially simultaneously with said first, second and gate electrodes of one of said second and third field effect transistors during manufacture of the integrated circuit semiconductor memory device; and
said first conductive line being formed substantially simultaneously with said second conductive line during manufacture of the integrated circuit semiconductor memory device.

2. An integrated circuit semiconductor memory device according to claim 1, wherein said first voltage potential is substantially a supply voltage level while said second voltage potential is substantially a ground voltage level; and
wherein said first field effect transistor is a positive channel type.

3. An integrated circuit semiconductor memory device according to claim 1, wherein said second voltage potential is substantially at a supply voltage level and said first voltage potential is substantially at a ground voltage level; and
wherein said first field effect transistor is of a negative channel type.

4. An integrated circuit semiconductor memory device comprising:
memory array having a plurality of memory cells and a sensing circuit for selectively coupling one of the memory cells;
a first conductive line for applying a first voltage potential to said sensing circuit;
a second conductive line, formed substantially simultaneously with said first conductive line during manufacture of the integrated circuit semiconductor memory device, for applying a second voltage potential to said sensing circuit; and
coupling means for capacitively coupling said first conductive line with said second conductive line;
wherein said coupling means has a first field effect transistor having first, second and gate electrodes;
said first and second electrodes of said first FET being respectively connected to said first conductive line, said gate electrode of said first field effect transistor being connected to said second conductive line;
wherein said sensing circuit includes a second field effect transistor; and
wherein said first field effect transistor is formed substantially simultaneously with said second field effect transistor during manufacture of the integrated circuit semiconductor memory device.

5. An integrated circuit semiconductor memory device according to claim 4, wherein said first voltage potential is substantially at a supply voltage level while said second voltage potential is substantially at a ground voltage level; and
wherein each of said first and second field effect transistors is of a positive channel type.

6. An integrated circuit semiconductor memory device according to claim 4, wherein said second voltage potential is substantially at a supply voltage level while said first voltage potential is substantially at a ground voltage level; and
wherein each of said first and second field effect transistors is of a negative channel type.

7. An integrated circuit semiconductor memory device comprising:
a plurality of memory arrays each having a plurality of memory cells and a sensing circuit for selectively coupling one of the memory cells;
a first conductive line for commonly applying a first voltage potential to said sensing circuits in said respective memory arrays;
a second conductive line, formed substantially simultaneously with said first conductive line during manufacture of the integrated circuit semiconductor memory device, for commonly applying a second voltage potential to said sensing circuits in said respective memory arrays;
coupling means for capacitively coupling said first conductive line with said second conductive line;
wherein said coupling means has a plurality of first field effect transistors each having first, second and gate electrodes;
wherein said first and second electrodes of each of said first field effect transistors are respectively connected to said first conductive line, and said gate electrode of each of said first field effect transistors is connected to said second conductive line;
wherein each of said sensing circuits includes a second field effect transistor; and
wherein said first field effect transistors are formed substantially simultaneously with said second field effect transistors during manufacture of the integrated circuit semiconductor memory device.

8. An integrated circuit semiconductor memory device according to claim 7, wherein said first voltage potential is substantially at a supply voltage level while said second voltage potential is substantially at a ground voltage level; and
wherein each of said first and second field effect transistors is of a positive channel type.

9. An integrated circuit semiconductor memory device according to claim 7, wherein said second voltage potential is substantially at a supply voltage level while said first voltage potential is substantially at a ground voltage level; and
wherein each of said first and second field effect transistors is of a negative channel type.

* * * * *